(12) United States Patent
Kim et al.

(10) Patent No.: US 12,114,518 B2
(45) Date of Patent: Oct. 8, 2024

(54) ELECTROLUMINESCENT DEVICE, MANUFACTURING METHOD THEREOF, AND DISPLAY DEVICE COMPRISING THE SAME

(71) Applicant: SAMSUNG ELECTRONICS CO., LTD., Suwon-si (KR)

(72) Inventors: Sung Woo Kim, Hwaseong-si (KR); Chan Su Kim, Seoul (KR); Tae Ho Kim, Seongnam-si (KR); Kun Su Park, Seongnam-si (KR); Eun Joo Jang, Suwon-si (KR); Jin A Kim, Suwon-si (KR); Tae Hyung Kim, Seoul (KR); Jeong Hee Lee, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 95 days.

(21) Appl. No.: 17/511,706

(22) Filed: Oct. 27, 2021

(65) Prior Publication Data

US 2022/0052288 A1    Feb. 17, 2022

Related U.S. Application Data

(63) Continuation of application No. 16/351,654, filed on Mar. 13, 2019, now Pat. No. 11,233,211.

(30) Foreign Application Priority Data

Mar. 14, 2018  (KR) .................. 10-2018-0029942
Mar. 12, 2019  (KR) .................. 10-2019-0028358

(51) Int. Cl.
*H10K 50/11*    (2023.01)
*H10K 30/10*    (2023.01)
(Continued)

(52) U.S. Cl.
CPC ............ *H10K 50/11* (2023.02); *H10K 30/10* (2023.02); *H10K 50/115* (2023.02); *H10K 50/15* (2023.02); *H10K 50/16* (2023.02); *H10K 85/649* (2023.02)

(58) Field of Classification Search
CPC ........ H10K 50/11; H10K 30/10; H10K 50/15; H10K 50/16; H10K 85/649; H10K 85/60
See application file for complete search history.

(56) References Cited

U.S. PATENT DOCUMENTS

| | | | |
|---|---|---|---|
| 6,645,645 | B1 | 11/2003 | Adachi et al. |
| 8,052,958 | B2 | 11/2011 | Lee et al. |

(Continued)

FOREIGN PATENT DOCUMENTS

| | | |
|---|---|---|
| CN | 103548171 A | 1/2014 |
| CN | 104064690 A | 9/2014 |

(Continued)

OTHER PUBLICATIONS

Albert M. DeBerardinis et al., "Facile Synthesis of a Family of H8BINOL-Amine Compounds and Catalytic Asymmetric Arylzinc Addition to Aldehydes," Journal of Organic Chemistry, Apr. 8, 2010, pp. 2836-2850, vol. 75.

(Continued)

*Primary Examiner* — Marvin Payen
(74) *Attorney, Agent, or Firm* — CANTOR COLBURN LLP

(57) ABSTRACT

An electroluminescent device, a method of manufacturing the same, and a display device including the same. The electroluminescent device includes a first electrode and a second electrode facing each other; an emission layer disposed between the first electrode and the second electrode, the emission layer including light emitting particles; an electron transport layer disposed between the first electrode (Continued)

and the emission layer; and a hole transport layer disposed between the second electrode and the emission layer, wherein the electron transport layer includes inorganic oxide particles and a metal-organic compound, the metal-organic compound or a thermal decomposition product of the metal-organic compound being soluble a non-polar solvent.

19 Claims, 10 Drawing Sheets

(51) Int. Cl.
*H10K 50/115* (2023.01)
*H10K 50/15* (2023.01)
*H10K 50/16* (2023.01)
*H10K 85/60* (2023.01)

(56) References Cited

U.S. PATENT DOCUMENTS

| | | |
|---|---|---|
| 9,373,823 B2 | 6/2016 | Chiba et al. |
| 9,905,790 B2 | 2/2018 | Koh et al. |
| 2006/0269463 A1 | 11/2006 | Lee et al. |
| 2011/0284825 A1 | 11/2011 | Yang et al. |
| 2011/0291071 A1 | 12/2011 | Kim et al. |
| 2013/0277669 A1 | 10/2013 | Krebs et al. |
| 2014/0084280 A1 | 3/2014 | Chiba et al. |
| 2015/0162564 A1* | 6/2015 | Kodama ............... H10K 59/00 257/40 |
| 2017/0117496 A1 | 4/2017 | Koh et al. |
| 2017/0221969 A1* | 8/2017 | Steckel ............... H10K 59/32 |

FOREIGN PATENT DOCUMENTS

| | | |
|---|---|---|
| CN | 106601886 A | 4/2017 |
| CN | 106654026 A | 5/2017 |
| EP | 2621599 A1 | 8/2013 |
| KR | 20060122616 A | 11/2006 |
| KR | 20150120026 A | 10/2015 |
| KR | 1620870 B1 | 5/2016 |
| KR | 20170048965 A | 5/2017 |
| KR | 20170105319 A | 9/2017 |

OTHER PUBLICATIONS

Extended European Search Report dated Aug. 1, 2019, of the corresponding European Patent Application No. 19162543.3.
Office Action dated Oct. 8, 2021, of the corresponding European Patent Application No. 19162543.3.
Office Action dated Mar. 30, 2024, of the corresponding Chinese Patent Application No. 201910192538.X.
KR Office Action dated Aug. 18, 2023 of the corresponding Korean Patent Application No. 10-2019-0028358.

* cited by examiner

ELECTROLUMINESCENT DEVICE, MANUFACTURING METHOD THEREOF, AND DISPLAY DEVICE COMPRISING THE SAME

CROSS-REFERENCE TO RELATED APPLICATION

This application is a continuation application of application Ser. No. 16/351,654, filed Mar. 13, 2019, which claims priority to and the benefit of Korean Patent Application No. 10-2018-0029942 filed in the Korean Intellectual Property Office on Mar. 14, 2018, and Korean Patent Application No. 10-2019-0028358 filed in the Korean Intellectual Property Office on Mar. 12, 2019, and all the benefits accruing therefrom under 35 U.S.C. § 119, the entire content of which is incorporated herein by reference.

BACKGROUND

1. Field

The present invention relates to an electroluminescent device, manufacturing method thereof, and a display device including the same.

2. Description of the Related Art

Quantum dots are a nanocrystal semiconductor material having a diameter of several to several hundreds of nanometers (nm), which exhibits quantum confinement effects. Quantum dots generate stronger, e.g., brighter, light in a narrow wavelength region than phosphor. Quantum dots emit light while the excited electrons are transitioned from a conduction band to a valance band and wavelengths are changed depending upon a particle size of the quantum dot. As quantum dots emit shorter wavelength light with decreasing particle size, quantum dots may provide light in a desirable wavelength region by adjusting the sizes of the quantum dots.

In other words, the emission layer including quantum dots and the various electronic devices including the same may reduce production costs, compared with the organic light emitting diode using the emission layer including phosphorescence and/or phosphor material, and the desirable color may be emitted by changing sizes of quantum dots, without use of other organic materials in the emission layer for emitting other color lights.

Luminous efficiency of the emission layer including quantum dots is determined by quantum efficiency of the quantum dots, a balance of charge carriers, light extraction efficiency, leakage current, and the like. That is, in order to improve the luminous efficiency of the emission layer, methods, such as adjusting excitons to be confined to the emission layer, adjusting holes and electrons to be smoothly transported to the quantum dots, or preventing leakage currents, may be used.

SUMMARY

An electroluminescent device having improved device characteristics by decreasing a leakage current and a display device including the same are provided.

According to an embodiment, an electroluminescent device includes a first electrode and a second electrode facing each other; an emission layer disposed between the first electrode and the second electrode, the emission layer including light emitting particles; an electron transport layer disposed between the first electrode and the emission layer; and a hole transport layer disposed between the second electrode and the emission layer, wherein the electron transport layer includes inorganic oxide particles and a metal-organic compound, the metal-organic compound or a thermal decomposition product of the metal-organic compound being soluble in a non-polar solvent.

The metal-organic compound may include Zn, Ti, Sn, W, Ta, Mg, Ga, Na, Cu, Ag, or a combination thereof.

The metal-organic compound may include an oleate compound, an amine compound, or a combination thereof.

The non-polar solvent may include a C6 to C20 linear, branched, or cyclic aliphatic hydrocarbon, a C6 to C20 aromatic hydrocarbon, methylene chloride, ethyl acetate, or a combination thereof.

The inorganic oxide particles may include zinc, titanium, zirconium, tin, tungsten, tantalum, magnesium, gallium, sodium, copper, silver, or a combination thereof.

The inorganic oxide particles may are dispersible in a polar solvent.

A surface of the electron transport layer facing the emission layer may include a first portion in which the inorganic oxide particles are disposed and a second portion in which the metal-organic compound or the thermal decomposition product of the metal-organic compound is between neighboring inorganic oxide particles.

The electron transport layer may include a first layer including the inorganic oxide particles and a second layer including the metal-organic compound or the thermal decomposition product of the metal-organic compound.

The second layer may be disposed between the first layer and the emission layer.

The first layer may include a cluster layer including the inorganic oxide particles.

A surface of the first layer facing the second layer may include the metal-organic compound or the thermal decomposition product of the metal-organic compound.

The first layer may include an organic matrix filled in between neighboring inorganic oxide particles and the organic matrix may include an organic material that is different from the metal-organic compound or the thermal decomposition product of the metal-organic compound.

An average thickness of the second layer may be less than an average thickness of the first layer.

The inorganic oxide particles may include metal oxide particles, and a metal in the metal oxide particles and a metal in the metal-organic compound are the same.

An average thickness of the electron transport layer may be about 20 nanometers (nm) to about 60 nm.

The light emitting particles may include quantum dots.

The light emitting particles may have a core-shell structure.

The light emitting particles may include a Group II-VI compound that does not include Cd, a Group III-V compound, a Group IV-VI compound, a Group IV element or compound, a Group compound, a Group I-II-IV-VI compound that does not include Cd, or a combination thereof.

A hydrophobic organic ligand may be attached to a surface of the light emitting particles.

On the other hand, a display device including the electroluminescent device according to an embodiment is provided.

An electroluminescent device having improved device characteristics by decreasing the leakage current may be provided.

In addition, as described above, a display device including the electroluminescent device having improved device characteristics is provided.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
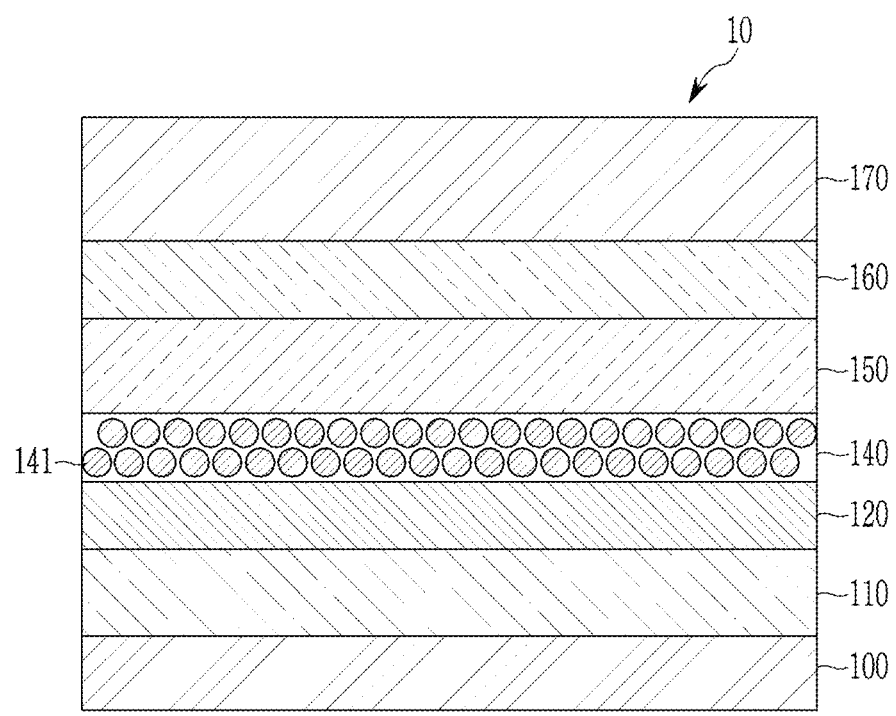
FIG. 1 is a schematic cross-sectional view of an electroluminescent device according to an embodiment.

Hereinafter, example embodiments will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "upper," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, "group" may refer to a group of Periodic Table. As used herein, "Group II" may refer to Group IIA and Group IIB, and examples of Group II metal may be Cd, Zn, Hg, and Mg, but are not limited thereto.

As used herein, examples of "Group II metal that does not include Cd" may refer to a Group II metal except Cd, for example, Zn, Hg, Mg, etc.

As used herein, "Group III" may refer to Group IIIA and Group IIIB, and examples of Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group I" may refer to Group IA and Group IB, and examples may include Li, Na, K, Rb, and Cs, but are not limited thereto.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

As used herein, "aliphatic" means a saturated or unsaturated linear or branched hydrocarbon group. An aliphatic group may be an alkyl, alkenyl, or alkynyl group, for example.

As used herein, an "amine" has the general formula NRR, wherein each R is independently hydrogen, a C1-C30 alkyl group, a C3-C8 cycloalkyl group a C2-C30 alkenyl group, a C2-C30 alkynyl group, or a C6-C30 aryl group, each of which may be substituted or unsubstituted.

As used herein, "aromatic" means an organic compound or group comprising at least one unsaturated cyclic group having delocalized pi electrons. The term encompasses both hydrocarbon aromatic compounds and heteroaromatic compounds.

In an embodiment, for particle diameters of particles, although the particle diameters may be quantitated by a measurement to show an average size of a group, the method may include a mode diameter showing the maximum value of the distribution, a median diameter corresponding to the center value of integral distribution curve, a variety of average diameters (numeral average, length average, area average, mass average, volume average, etc.), and the like. Unless particularly mentioned otherwise, "average particle diameters" means numeral average diameters in the present disclosure, and the average particle diameter is obtained by measuring D50 (particle diameters at a position of distribution rate of 50%).

In an embodiment, "solubility" indicates property that a solute is well dissolved in a particular solvent. In an embodiment, when a solute is well dissolved in a non-polar solvent, the corresponding solute may be expressed as having a solubility regarding, e.g., in, the non-polar solvent, while a solute is well dissolved in a polar solvent, the corresponding solute may be expressed as having a solubility regarding, e.g., in, the polar solvent.

Unless otherwise described in an embodiment, a thickness of each constituent element may refer to "an average thickness."

The "average thickness" of each constituent element is calculated by extracting arbitrary 5 to 10 points from a scanning electron microscopic (SEM) cross-sectional image of each constituent element, measuring thicknesses, and calculating an arithmetic average of the measured thicknesses.

Figure 2:
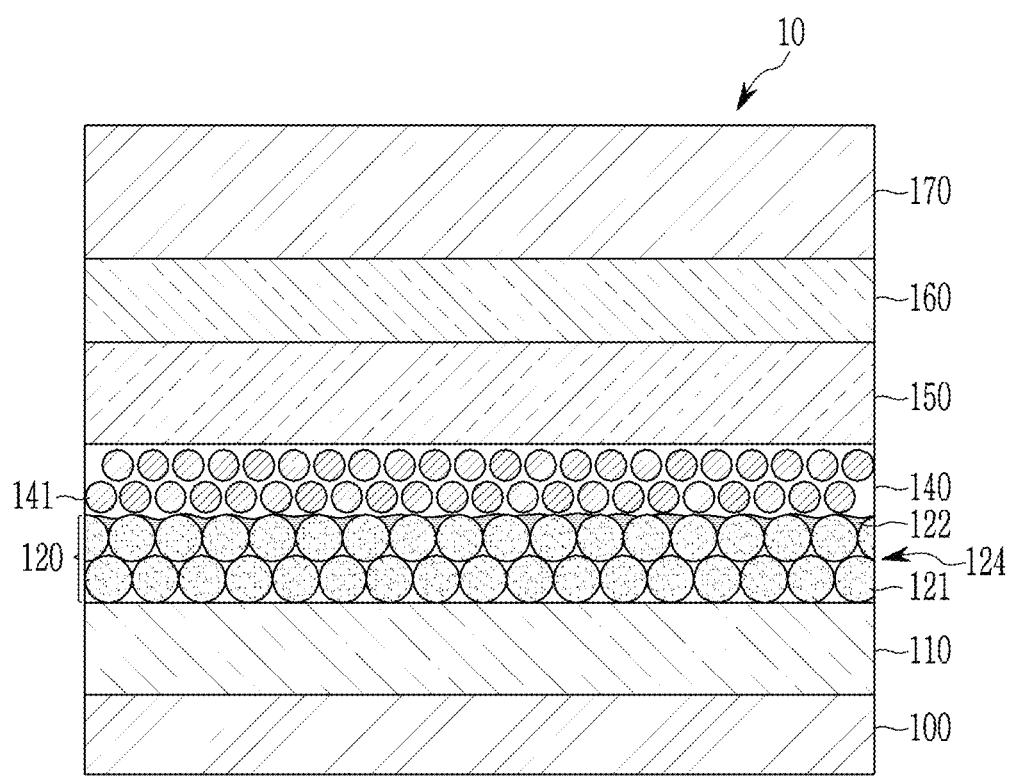
FIGS. 2 to 4 are cross-sectional views illustrating various positional relationships between inorganic oxide particles, a metal-organic compound, and a thermal decomposition product thereof in an electron transport layer of an electroluminescent device according to an embodiment.
Figure 3:
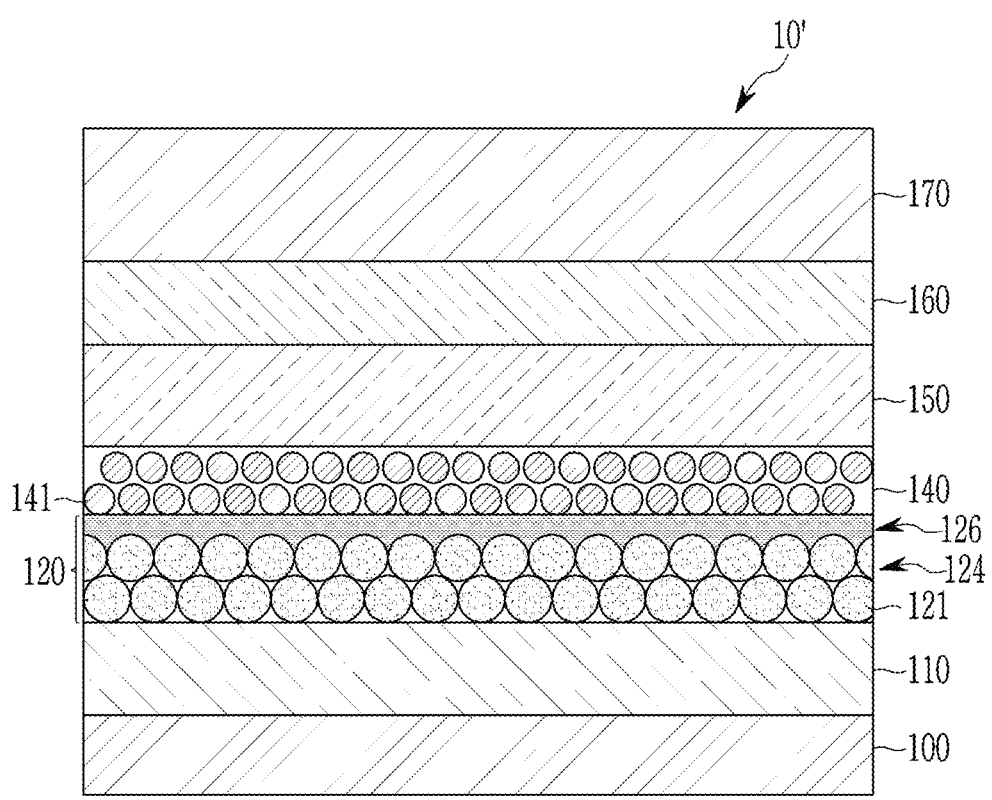
Figure 4:
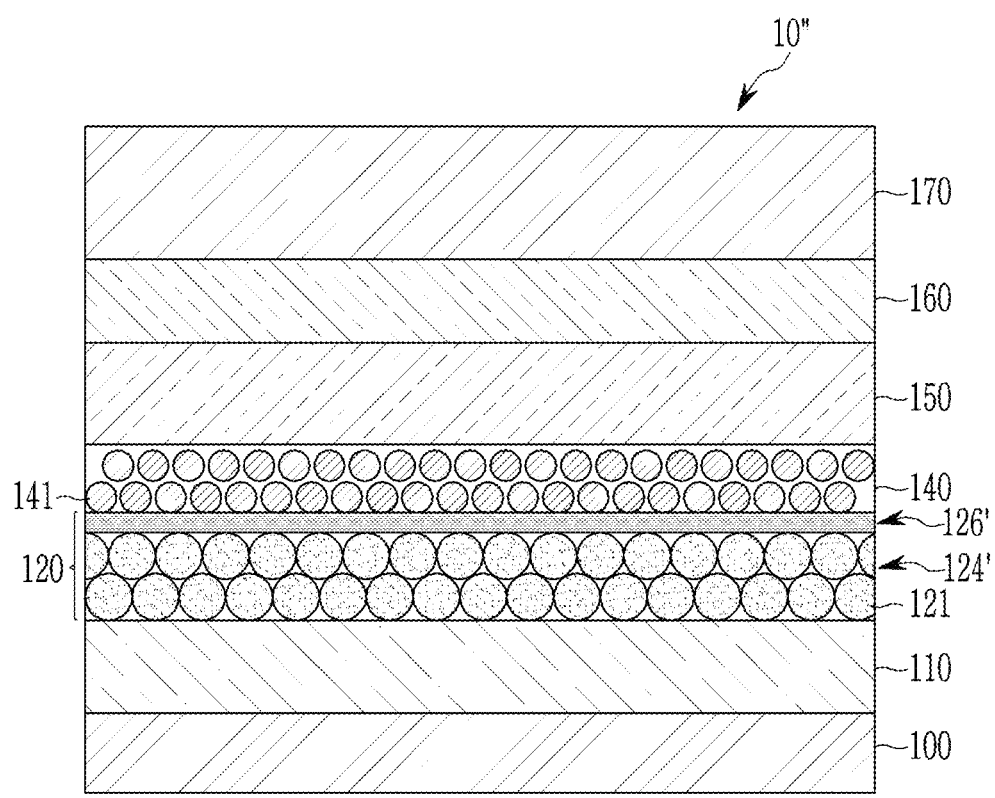

FIG. 1 is a schematic cross-sectional view of an electroluminescent device according to an embodiment and FIGS. 2 to 4 are cross-sectional views illustrating various positional relationships between inorganic oxide particles, a metal-organic compound, and a thermal decomposition product thereof in an electron transport layer of an electroluminescent device according to an embodiment.

An electroluminescent device 10 according to an embodiment includes a first electrode 110 and a second electrode 170 facing each other, an emission layer 141 disposed between the first electrode 110 and the second electrode 170 and including light emitting particles 141; an electron transport layer 120 disposed between the first electrode 110 and the emission layer 140; and a hole transport layer 150 disposed between the second electrode 170 and the emission layer 140, and a hole injection layer 160 that is disposed between the hole transport layer 150 and the second electrode 170 and may be omitted in consideration of a relationship of each constituent element.

The electroluminescent device 10 may have a laminate structure where the electron transport layer 120, the emission layer 140, the hole transport layer 150, and the hole injection layer 160 are disposed between the first electrode 110 and the second electrode 170 facing each other.

The electroluminescent device 10 according to an embodiment supplies current to the emission layer 140 through the first electrode 110 and the second electrode 170 and causes electroluminescence of the light emitting particles 141 to generate light. The electroluminescent device 10 may generate light in various wavelength regions according to materials, sizes, or fine structures of the light emitting particles 141 of the emission layer 140.

In an embodiment, the first electrode 110 and the second electrode 170 may be respectively connected to a driving power source and may function to supply current to the emission layer 140. One of the first electrode 110 and the second electrode 170 may be an anode and the other may be a cathode. In an embodiment, the first electrode 110 may be a cathode and the second electrode 170 may be an anode.

At least one of the first electrode 110 and the second electrode 170 may include a material having light transmittance in at least visible light wavelength region but is not limited thereto. The first electrode 110 may include a material having light transmittance in an infrared or ultraviolet (UV) wavelength region. For example, the first electrode 110 may include an optically transparent material. For example, the second electrode 170 may include an optically transparent material. For example, the first electrode 110 and the second electrode 170 may include an optically transparent material.

In an embodiment, the optically transparent material may include, for example, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, tin oxide, indium tin oxide, indium zinc oxide, or a combination thereof, or silver (Ag), aluminum (Al), copper (Cu), gold (Au), an alloy thereof, or a combination thereof.

In an embodiment, one of the first electrode 110 and the second electrode 170 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, tin oxide, indium tin oxide, indium zinc oxide, or a combination thereof and the other of the first electrode 110 and the second electrode 170 may include silver (Ag), aluminum (Al), copper (Cu), gold (Au), an alloy thereof, or a combination thereof. For example, the first electrode 110 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, tin oxide, indium tin oxide, indium zinc oxide, or a combination thereof and the second electrode 170 may include silver (Ag), aluminum (Al), copper (Cu), gold (Au), an alloy thereof, or a combination thereof.

However, the first electrode 110 and/or the second electrode 170 according to an embodiment are not necessarily limited thereto but may include a material further having light transmittance with respect to light in an infrared or ultraviolet (UV) wavelength region or a semi-permeable material selectively transmitting light in a particular wavelength region and may conduct a function of reflecting light in a visible light wavelength region.

Each of the first electrode 110 and the second electrode 170 may be formed by depositing a material for forming an electrode on the substrate 100 or an organic layer by a method such as sputtering or deposition.

Meanwhile, in an embodiment, the first electrode 110 may be disposed on the substrate 100 as shown in FIG. 1. The substrate 100 may be a transparent insulating substrate or may include a ductile material. The substrate 100 may include glass or a polymer material, and the polymer material may have, for example, a glass transition temperature (Tg) of greater than or equal to about 150° C. For example, the substrate 100 may include a COC (cycloolefin copolymer) or COP (cycloolefin polymer) based material.

In an embodiment, the substrate 100 may support the electron transport layer 120, the emission layer 140, the hole transport layer 150, and the hole injection layer 160 disposed between the first electrode 110 and the second electrode 170.

However, the substrate 100 of the electroluminescent device 10 according to an embodiment may not be disposed under the first electrode 110, but the substrate 100 of the electroluminescent device 10 may be disposed on the second electrode 170 or may be omitted, as desired.

In an embodiment, the electron transport layer 120 is disposed between the first electrode 110 and the emission layer 140 and transports charges from the first electrode 110 into the emission layer 140. The charges may be electrons.

In an embodiment, an average thickness of the electron transport layer 120 may be variously changed in consideration of a charge carrier balance of the hole transport layer 150, the hole injection layer 160, the emission layer 140, or a combination thereof in the device, but may be, for example, greater than or equal to about 20 nm, greater than or equal to about 25 nm, greater than or equal to about 30 nm, greater than or equal to about 35 nm, or greater than or equal to about 40 nm, and, for example, less than or equal to about 100 nm, less than or equal to about 90 nm, less than or equal to about 80 nm, less than or equal to about 70 nm, less than or equal to about 60 nm, less than or equal to about 55 nm, or less than or equal to about 50 nm, for example, about 20 nm to about 60 nm, about 30 nm to about 60 nm, or about 40 nm to about 60 nm.

When the average thickness of the electron transport layer 120 is less than about 20 nm, voids, cracks, and the like of the electron transport layer 120 may be increased and the device characteristics may be deteriorated, and it may be difficult to meet, e.g., achieve, a carrier balance with other constituent elements of the electroluminescent device.

On the other hand, when the average thickness of the electron transport layer 120 is greater than about 100 nm, electrons may be supplied to the emission layer 140 too fast, in too great a quantity, or a combination thereof compared with holes, and electrons may meet holes on the interface between the emission layer 140 and the hole transport layer 150 to cause interfacial light emission or may move to the hole transport layer 150, the hole injection layer 160, or a combination thereof to be quenched.

In an embodiment, the electron transport layer 120 may include inorganic oxide particles 121. For example, the electron transport layer 120 may include a cluster layer composed of the inorganic oxide particles 121.

In an embodiment, the inorganic oxide particles 121 may be composed of materials having electron transporting properties and thus the inorganic oxide particles 121 may have electron transporting properties. The inorganic oxide particles 121 according to an embodiment may be, for example, oxides including zinc, titanium, zirconium, tin, tungsten, tantalum, magnesium, gallium, sodium, copper, silver, or a combination thereof and may include, for example, ZnO, $TiO_2$, $ZrO_2$, $SnO_2$, $WO_3$, $Ta_2O_3$, or a combination thereof, but are not limited thereto.

The inorganic oxide particles 121 according to an embodiment may have dispersibility with respect to, e.g., be dispersible in, a polar solvent. The dispersibility of the inorganic oxide particles 121 may be caused by the hydroxyl group (—OH) on the surface of the inorganic oxide particles 121 at room temperature. For example, ZnO particles may include a large numbers of hydroxyl groups (—OH) on the surface at room temperature. Therefore, when the ZnO particles are introduced into a polar solvent such as water or ethanol at room temperature, the ZnO particles may be controlled to be dispersed evenly in the polar solvent without being agglomerated by a relatively simple physical treatment such as stirring.

Accordingly, it may be relatively easy to form a cluster layer composed of the inorganic oxide particles 121 by applying a solution in which the inorganic oxide particles 121 are dispersed in a polar solvent on the first electrode 110 and then drying the solution. In addition, the cluster layer formed thereon may have a relatively uniform distribution of the inorganic oxide particles 121 without agglomerating at a specific portion.

On the other hand, an average particle diameter of the inorganic oxide particles 121 according to an embodiment may be, for example, less than or equal to about 70 nm, less than or equal to about 60 nm, less than or equal to about 50 nm, less than or equal to about 40 nm, less than or equal to about 30 nm, less than or equal to about 20 nm, or less than or equal to about 10 nm, and, for example, greater than or equal to about 1 nm, greater than or equal to about 2 nm, greater than or equal to about 3 nm, greater than or equal to about 4 nm, or greater than or equal to about 5 nm.

When the average particle diameter of the inorganic oxide particles 121 is within the above ranges, the cluster layer composed of the inorganic oxide particles 121 may exhibit excellent electron transporting properties.

In an embodiment, the electron transport layer 120 may include a metal-organic compound or a thermal decomposition product thereof having solubility with respect to, e.g., being soluble in, a non-polar solvent.

The metal-organic compound may be a metal salt having an organic group and may be, for example, a composite of a metal cation and an organic anion. The metal-organic compound has electron transporting properties like the above-mentioned inorganic oxide particles 121 but may have solubility with respect to a non-polar solvent, unlike the inorganic oxide particles 121.

In an embodiment, the metal-organic compound may have the same or a similar level of electron transporting properties compared with the inorganic oxide particles 121. The metal in the metal-organic compound may be a metal of Zn, Ti, Sn, W, Ta, Mg, Ga, Na, Cu, Ag, or a combination thereof.

On the other hand, the electron mobility and energy level of the metal-organic compound may vary depending on the metal, organic compound, or a combination thereof, but the electron mobility, the energy level, or a combination thereof may be the same as or similar to those of the inorganic oxide particles 121.

For example, the metal in the metal-organic compound may be the same as the metal in the inorganic oxide particles 121. For example, the inorganic oxide particles 121 may be metal oxide particles, and the metal element included in the metal oxide particles and the metal element contained in the metal-organic compound may be the same each other. In this case, it may be relatively easy to control the energy level, the electron mobility, or a combination thereof of the electron transport layer 120 to the same or a similar level.

However, an embodiment is not necessarily limited thereto, and the metal in the inorganic oxide particles 121 and the metal of the metal-organic compound may be different from each other in consideration of a charge carrier balances between the respective constituent elements of the electroluminescent element 10.

In an embodiment, the organic compound in the metal-organic compound imparts solubility with respect to the non-polar solvent to the metal-organic compound. The organic compound may include an oleate-based compound, an amine-based compound, or a combination thereof. For example, the organic compound may be an oleate-based compound. However, an embodiment is not limited thereto, and the organic compound may include an oleate-based compound, an amine-based compound, a combination thereof, or at least other organic compounds that are different from the oleate-based compound or the amine-based compound.

In addition, examples of the non-polar solvent for dissolving the metal-organic compound may a C6 to C20 linear, branched, or cyclic aliphatic hydrocarbon, C6 to C20 aromatic hydrocarbon, methylene chloride, ethyl acetate, or a combination thereof. The C6 to C20 linear, branched, or cyclic aliphatic hydrocarbon may contain one or more unsaturated groups, but is not aromatic. Heteroatoms may or may not be present in the aliphatic or aromatic hydrocarbons, and are only present provided that the aliphatic or aromatic hydrocarbons are nonpolar.

When the organic compound in the metal-organic compound according to an embodiment is as disclosed above, a solution containing a metal-organic compound in a non-polar solvent may be applied to the cluster layer and then dried to form an electron transport layer 120 in a relatively simple manner.

Specifically, since the above-described cluster layer is produced using a polar solvent, when the metal-organic compound having solubility with respect to a polar solvent is used, the cluster layer may be damaged by the polar solvent. However, since the metal-organic compound according to an embodiment uses a non-polar solvent having chemical characteristics different from those of the inorganic oxide particles 121, damage to the surface of the cluster layer may be minimized when the metal-organic compound is applied on the cluster layer.

The thermal decomposition product of the metal-organic compound may refer to a product obtained by thermally decomposing a solution including the metal-organic compound in a process of coating and drying at a predetermined temperature. The thermal decomposition product of the metal-organic compound may include a metal, metal oxide, an organic compound, or a combination thereof.

Specifically, the thermal decomposition product may include a metal of Zn, Ti, Sn, W, Ta, Mg, Ga, Na, Cu, Ag, or a combination thereof, or oxides thereof, and carbon compounds.

The carbon compound may be a product in which the organic compound in the metal-organic compound, specifically, the oleate compound, the amine compound, and other organic compounds are separated from the metal by the thermal decomposition of the metal-organic compound, or a derivative thereof. The thermal decomposition product may be chemically bound to the surface of the inorganic oxide particles 121.

The carbon compound may have solubility with respect to a non-polar solvent.

When the metal-organic compound or the thermal decomposition product thereof are included together with the inorganic oxide particles 121 as in the embodiment, there is a difference in an energy level change compared with the case where the inorganic oxide particles 121 are doped with metal.

Specifically, when Mg is used as a metal in the metal-organic compound and ZnO particles are used as the inorganic oxide particles 121, the electron transport layer 120 in which the pure Mg-organic compound or the thermal decomposition product thereof and the ZnO particles are mixed has slightly reduced lowest unoccupied molecular orbital (LUMO) energy and highest occupied molecular orbital (HOMO) energy levels compared with the electron transport layer including the ZnO particles alone. On the other hand, ZnMgO in which ZnO is doped with Mg may exhibit slightly increased LUMO and HOMO energy levels compared with the electron transport layer including ZnO particles alone.

In an embodiment, amounts of the metal-organic compound may be changed variously by regarding the relationship between the above-described energy level, electron mobility. The amounts of the metal-organic compound may be variously adjusted in consideration of, for example, the organic compound bonding with the metal, the inorganic oxide particles 121, thicknesses of the electron transport layer 120, and the like.

Referring to FIGS. 2 to 4, the electron transport layer 120 in the electroluminescent devices 10, 10', and 10" may include a first layer including a cluster layer composed of the inorganic oxide particles 121. In this case, the metal-organic compound or the thermal decomposition product thereof may be disposed at various positions between the first layer 124 and the emission layer 140.

The average thickness of the first layer 124 may be changed in consideration of average particle diameters and materials of the inorganic oxide particles 121 and charge carrier balances between the emission layer 140, the hole transport layer 150, or a combination thereof, the hole injection layer 160, and the like. However, the average thickness of the first layer 124 may be, for example, less than or equal to about 60 nm, less than or equal to about 50 nm, less than or equal to about 40 nm, less than or equal to about 35 nm, or less than or equal to about 30 nm, and, for example, greater than or equal to about 20 nm, greater than or equal to about 25 nm, or greater than or equal to about 30 nm.

When the average thickness of the first layer 124 satisfies the above ranges, the first layer 124 may exhibit excellent electron transporting properties.

Referring to FIG. 2, a metal-organic compound or a thermal decomposition product thereof 122 in the electroluminescent device 10 directly contacts the surface of the first layer 124 facing the emission layer 140 and also may fill an empty space on the surface.

Specifically, with reference to the surface of the electron transport layer 120 facing the emission layer 140, the surface may include a first region in which the inorganic oxide particles 121 is present and a second region in which the metal-organic compound or the thermal decomposition product thereof 122 filling the empty space among the neighboring inorganic oxide particles 121 is present.

On the surface of the electron transport layer 120 facing the emission layer 140, the inorganic oxide particles 121 may be mixed with the metal-organic compound or the thermal decomposition product thereof 122.

Accordingly, as for the electroluminescent device 10 according to FIG. 2, the electron transport layer 120 may be a composite layer including the first layer 124 including the inorganic oxide particles 121 and a layer including the metal-organic compound or the thermal decomposition product thereof 122 and filling an empty space on the surface of the first layer 124 facing an emission layer, as described above.

On the other hand, referring to FIG. 3, an electroluminescent device 10' may further include a second layer 126 having a predetermined thickness between the emission layer 140 and the first layer 124 unlike the electroluminescent device 10 according to FIG. 2, wherein the second layer 126 may include a metal-organic compound or a thermal decomposition product thereof. For example, the second layer 126 may be a layer formed of the metal-organic compound or the thermal decomposition product thereof.

Specifically, the surface of the electron transport layer 120 facing the emission layer 140 may be the surface of the second layer 126, and the inorganic oxide particles 121 may not be exposed to the surface but covered by the second layer 126 unlike the electroluminescent device 10 according to FIG. 2. The surface of the second layer 126 facing the emission layer 140 may be relatively smooth compared with the surface of the first layer 124 contacting the second layer 126. Accordingly, morphology of the electron transport layer 120 contacting the emission layer 140 may be improved.

As for the electroluminescent device 10' of FIG. 3 like the electroluminescent device 10 of FIG. 2, the surface of the first layer 124 directly contacts the metal-organic compound or the thermal decomposition product thereof, which may fill an empty space on the surface of the first layer 124.

The second layer 126 according to an embodiment has a thickness enough to at least cover the surface of the first layer 124 contacting itself and not to expose the inorganic oxide particles 121 toward the emission layer 140, as described above. On the other hand, the second layer 126 may be formed to be thicker than a desired thickness in consideration of interaction with a solution for forming the emission layer 140 during formation of the emission layer 140 which will be described later.

In an embodiment, the second layer 126 may have a thinner average thickness than that of the first layer 120 in consideration of all the above conditions, for example, an average thickness of greater than or equal to about 2 nm, greater than or equal to about 3 nm, greater than or equal to about 4 nm, greater than or equal to about 5 nm, or greater than or equal to about 10 nm, and, for example, less than or equal to about 15 nm, for example, in a range of about 3 nm to about 15 nm, for example, in a range of about 5 nm to about 15 nm, for example, in a range of about 7 nm to about 15 nm, or for example, in a range of about 10 nm to about 15 nm.

When the second layer 126 has an average thickness of less than about 2 nm, the thickness of the second layer 126 may be decreased by a non-polar solvent during formation of the emission layer 140 which will be described later, and the inorganic oxide particles 121 may be exposed. On the other hand, when the second layer 126 has an average thickness of greater than about 15 nm, a charge carrier balance of the whole electroluminescent device may be deteriorated.

In the electroluminescent devices 10 and 10' according to FIGS. 2 and 3, the empty space on the surface of the first layer 124 may be changed depending on an average particle diameter of the inorganic oxide particles 121, the thickness of the first layer 124, and the like but inevitably formed, since the first layer 124 is a cluster layer formed of the inorganic oxide particles 121. The empty space includes a void, a crack, or the like among the inorganic oxide particles 121.

The empty space may function as a leakage path of electrons during operation of a device and may not be completely removed, though the first layer 124 may be formed by using inorganic oxide having excellent dispersibility regarding, e.g., in, a polar solvent.

However, in the electroluminescent devices 10 and 10' of FIGS. 2 and 3, the empty space of the first layer 124 may not only be filled with a metal-organic compound or a thermal decomposition product thereof, but also the surface of the first layer 124 may be covered by the second layer 126 as shown in the electroluminescent device 10' of FIG. 3.

In other words, as for the electroluminescent devices 10 and 10' of FIGS. 2 and 3, a leakage path of an electron transport layer may be reduced by filling the space of the first layer 124 with the metal-organic compound or the thermal decomposition product thereof.

However, an embodiment is not necessarily limited thereto. For example, as for an electroluminescent device 10" of FIG. 4, a first layer 124' may include an organic material matrix filled among the, e.g., in between, neighboring inorganic oxide particles 121 unlike the cluster layer of the electroluminescent devices 10 and 10' of FIGS. 2 and 3. Herein, the organic material matrix may include an organic material of a monomer, an oligomer, a polymer, or a combination thereof, wherein the organic material may be different from the metal-organic compound or the thermal decomposition product thereof.

For example, the organic material matrix may be a binder. In other words, the first layer 124' may be a mixed layer of the inorganic oxide particles 121 and an organic material functioning as a binder. The organic material matrix may include various suitable organic materials without being particularly limited, provided that the organic material is different from the metal-organic compound or the thermal decomposition product thereof and functions as a binder.

On the other hand, the second layer 126' may not fill an empty space inside the first layer 124' but cover the first layer 124', and the surface of the first layer 124' may not be exposed to the emission layer 140. Herein, morphology of the surface of the first layer 124' may be improved by covering the surface of the first layer 124' with the second layer 126', through which a leakage current of an electron transport layer may be reduced.

In an embodiment, the electroluminescent devices 10' and 10" according to FIGS. 3 and 4 may have an equal or almost similar energy level between the first layers 124 and 124' and the second layers 126 and 126'. For example, when the same metal is used for the first layers 124 and 124' and the second layers 126 and 126', a LUMO energy level of the second layers 126 and 126' may be subtly increased by an organic compound and the like compared with that of the first layers 124 and 124'.

However, a LUMO energy level difference between the second layers 126 and 126' and the first layers 124 and 124' may be, for example, less than or equal to about 0.3 electronvolts (eV), less than or equal to about 0.2 eV, or less than or equal to about 0.1 eV and may be designed to be close to 0 eV by changing a metal and an organic compound used for an electron transport layer as described above.

On the other hand, an embodiment is not necessarily limited thereto, but the second layers 126 and 126' and the first layers 124 and 124' may be variously adjusted to have a LUMO energy level difference of, for example, greater than about 0.3 eV, for example, greater than or equal to about 0.4 eV, greater than or equal to about 0.5 eV, or, for example, in a range of about 0.3 eV to about 0.7 eV. However, thicknesses of the second layers 126 and 126' and the like may be adjusted to minimize the second layers 126 and 126' from working as an energy barrier.

On the other hand, between the electron transport layer 120 and the first electrode 110, an electron injection layer facilitating injection of electrons, a hole blocking layer blocking movement of holes, or a combination thereof may be further formed.

Each average thickness of the electron injection layer and the hole blocking layer may be appropriately selected. For example, an average thickness of each layer may be greater than or equal to about 1 nm and less than or equal to about 500 nm but is not limited thereto. The electron injection layer may be an organic layer formed by deposition and may be omitted in consideration of the thicknesses and materials of the electron transport layer 120.

The electron injection layer may include, for example, 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl) phenyl)quinolone), 8-hydroxyquinolinato lithium (Liq), an n-type metal oxide (e.g., ZnO, $HfO_2$, etc.), or a combination thereof, but is not limited thereto.

The hole blocking layer may include, for example, 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, or a combination thereof, but is not limited thereto. The hole blocking layer may be omitted in consideration of the thicknesses, materials, and the like of other constituent elements in the electroluminescent device 10.

The emission layer 140 may be disposed between the electron transport layer 120 and the hole transport layer 150. The emission layer 140 may be in contact with the electron transport layer 120 and may include at least two light emitting particles.

The emission layer 140 is a site to which electrons and holes are transported by a current supplied from the first electrode 110 and the second electrode 170. The electrons and holes are combined in the emission layer 140 to generate excitons, and the generated excitons are transitioned from an exited state to a ground state to emit light in a wavelength corresponding to a size of the light emitting particles 141.

On the other hand, the emission layer 140 may emit light in a predetermined wavelength region. The predetermined wavelength region belongs to a visible light region, for example, one of a first wavelength region of about 380 nm to about 488 nm, a second wavelength region of about 490 nm to 510 nm, a third wavelength region of greater than 510 nm to about 580 nm, a fourth wavelength region of about 582 nm to about 600 nm, and a fifth wavelength region of about 620 nm to about 680 nm.

In an embodiment, the light emitting particles 141 may include quantum dots. That is, all of the light emitting particles 141 may be quantum dots. One of the light emitting particles 141 may be formed of quantum dots, and another of the light emitting particles 141 may be a different light emitting body distinguished from the quantum dot, for example, a commercially available phosphor.

The quantum dots have a discontinuous energy band gap by the quantum confinement effect so as to convert incident light to light having a predetermined wavelength and to radiate the same. That is, when the light emitting particles 141 are composed of quantum dots, the emission layer 140 may generate light having excellent color reproducibility and color purity.

In an embodiment, a material of the quantum dots is not particularly limited and the quantum dots 3 may be commercially available. For example, the light emitting particles 141 according to an embodiment may be quantum dots including a Group II-VI compound that does not include Cd, a Group III-V compound, a Group IV-VI compound, a Group IV element or compound, a Group compound, a Group I-II-IV-VI compound that does not include Cd, or a combination thereof. That is, the light emitting particles 141 according to an embodiment may be non-cadmium-based quantum dots. Like this, when the light emitting particles 141 are formed of non-cadmium-cadmium-based materials, the light emitting particles 141 may have little or no toxicity compared with a conventional cadmium-based quantum dots and thus are not dangerous and environmentally-friendly.

The Group II-VI compound may be a binary element compound of ZnS, ZnSe, ZnTe, ZnO, HgS, HgSe, HgTe, MgSe, MgS, or a combination thereof; a ternary element compound of ZnSeS, ZnSeTe, ZnSTe, HgSeS, HgSeTe, HgSTe, HgZnS, HgZnSe, HgZnTe, MgZnSe, MgZnS, or a combination thereof; or a quaternary element compound of ZnSeSTe, HgZnTeS, HgZnSeS, HgZnSeTe, HgZnSTe, or a combination thereof. The Group II-VI compound may further include a Group III metal.

The Group III-V compound may be a binary element compound of GaN, GaP, GaAs, GaSb, AlN, AlP, AlAs, AlSb, InN, InP, InAs, InSb, or a combination thereof; a ternary element compound of GaNP, GaNAs, GaNSb, GaPAs, GaPSb, AlNP, AlNAs, AlNSb, AlPAs, AlPSb, InNP, InNAs, InNSb, InPAs, InPSb, InZnP, or a combination thereof; or a quaternary element compound of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof. The Group III-V compound may further include a Group II metal (InZnP).

The Group IV-VI compound may be a binary element compound of SnS, SnSe, SnTe, PbS, PbSe, PbTe, or a combination thereof; a ternary element compound of SnSeS, SnSeTe, SnSTe, PbSeS, PbSeTe, PbSTe, SnPbS, SnPbSe, SnPbTe, or a combination thereof; or a quaternary element compound of SnPbSSe, SnPbSeTe, SnPbSTe, or a combination thereof. Examples of the Group compound may be $CuInSe_2$, $CuInS_2$, CuInGaSe, or CuInGaS, but are not limited thereto. Examples of the Group I-II-IV-VI compound may be CuZnSnSe or CuZnSnS, but are not limited thereto. Examples of the Group IV compound may be a single substance of Si, Ge, or a combination thereof; or a binary element compound of SiC, SiGe, or a combination thereof.

The binary element compound, the ternary element compound or the quaternary element compound respectively exist in a uniform concentration in the particle or in partially different concentrations in the same particle.

According to an embodiment, the quantum dot may have a core-shell structure including one semiconductor nanocrystal core and another semiconductor nanocrystal shell surrounding the core. The core and the shell may have a concentration gradient wherein the concentration of the element(s) of the shell decreases in a direction from an outermost surface of the quantum dot toward the core. In addition, the quantum dot may have one semiconductor nanocrystal core and multi-shells surrounding the core. Herein, the multi-layered shell structure has a structure of two or more shells and each layer may have a single composition or an alloy or may have a concentration gradient.

In an embodiment, the light emitting particles may have a core-shell structure. When the light emitting particles have a core-shell structure, a material composition of the shell has a larger energy bandgap than that of the core, which may exhibit an effective quantum confinement effect. However, the embodiment is not limited thereto. Meanwhile, in the multi-layered shell, a shell that is outside of the core has may have a higher energy bandgap than a shell that is near to the core and quantum dots may have an ultraviolet (UV) to infrared wavelength ranges.

The quantum dot may have quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 90%, or 100%.

In a display, the quantum dot may have a relatively narrow spectrum so as to improve color purity or color reproducibility. The quantum dot may have, for example, a full width at half maximum (FWHM) of wavelength spectrum of less than or equal to about 45 nm, less than or equal to about 40 nm, or less than or equal to or about 30 nm. Within the ranges, color purity or color reproducibility of a device may be improved.

The quantum dot may have a particle diameter (the longest diameter for a non-spherically shaped particle) of about 1 nm to about 100 nm). For example, the quantum dot may have a particle diameter of about 1 nm to about 20 nm, for example, about 2 nm (or about 3 nm) to about 15 nm.

In addition, a shape of the quantum dot may be any suitable shape and thus may not be particularly limited. For example, the quantum dot may have a spherical, oval, tetrahedral, pyramidal, cuboctahedral, cylindrical, polyhedral, multi-armed, or cube nanoparticle, nanotube, nanowire, nanofiber, nanosheet, or a combination thereof. The quantum dot may have any suitable cross-sectional shape.

The quantum dot may be commercially available or may be synthesized in any suitable method. For example, several nano-sized quantum dots may be synthesized according to a wet chemical process. In the wet chemical process, precursors react in an organic solvent to grow crystal particles, and the organic solvent or a ligand compound may coordinate, e.g., become bound to, the surface of the quantum dot, controlling the growth of the crystal. Examples of the organic solvent and the ligand compound may be readily determined by one skilled in the art. The organic solvent coordinated on the surface of the quantum dot may affect stability of a device, and thus residues that are not coordinated on the surface of the nanocrystals may be removed by pouring the organic solvent including the crystal in excess non-solvent and centrifuging the resulting mixture. Examples of the non-solvent may be acetone, ethanol, methanol, or the like, but are not limited thereto. After the removal of residues, the amount of ligand compounds, organic solvents, or a combination thereof which are coordinated on the surface of the quantum dot may be less than or equal to about 50% by weight, for example, less than or equal to about 30 wt %, less than or equal to about 20 wt %, or less than or equal to about 10 wt % based on a weight of the quantum dot.

A hydrophobic organic ligand having a hydrophobic moiety may be bound to the surface of the light emitting particle. In an embodiment, the hydrophobic organic ligand may include RCOOH, $RNH_2$, $R_2NH$, $R_3N$, RSH, $R_3PO$, $R_3P$, ROH, RCOOR', $RPO(OH)_2$, $R_2POOH$ (wherein, R and R' are independently a C5 to C24 alkyl group, a C5 to C24 alkenyl group, a C5 to C20 alicyclic group, or a C6 to C20 aryl group), a polymeric organic ligand compound, or a combination thereof. For example, the hydrophobic organic ligand may be oleic acid, palmitic acid, myristic acid, stearic acid, or a combination thereof. The hydrophobic organic ligand may be an organic ligand having a mono-functional group, and the functional group may be chemically bound to the surface of the quantum dot.

When the hydrophobic organic ligand is attached to the surface of the light emitting particles, according to an embodiment, both of the light emitting body particles and the light emitting layer as a whole may have, e.g., exhibit, hydrophobicity. If the emissive layer 140 has, e.g., exhibits, hydrophobicity, the emissive layer 140 may be vulnerable to a non-polar solvent. That is, when the emission layer 140 and the non-polar solvent are in contact with each other, the emission layer 140 may be damaged by the non-polar solvent and thus device characteristics may be deteriorated.

However, the electroluminescent device 10 according to an embodiment may include the aforementioned metal-organic compound or thermal decomposition product thereof between a cluster layer formed of the inorganic oxide particles 121 and the emission layer 140 as described above, wherein the metal-organic compound or the thermal decomposition product thereof may fill an empty space on the surface of the cluster layer and form a layer having a predetermined thickness between the cluster layer and the emission layer 140. Accordingly, when the emission layer 140, which is hydrophobic, is formed on the already-formed electron transport layer 120, the emission layer may be prevented from a damage by a non-polar solvent.

The hole transport layer 150 may be disposed between the emission layer 140 and the second electrode 170, between the hole injection layer 160 and the emission layer 140, or between the emission layer 140 and the second electrode 170 and between the hole injection layer 160 and the emission layer 140. The hole transport layer 150 may provide and transport holes into the emission layer 140. The hole transport layer 150 may be formed directly under the emission layer 140 and may directly contact the emission layer 140.

In an embodiment, the hole transport layer 150 may be formed of the p-type semiconductor material, or the material doped with a p-type dopant. For example, the hole transport layer 150 may include a PEDOT (poly(3,4-ethylenedioxythiophene)) derivative, a PSS (poly(styrene sulfonate)) derivative, a poly-N-vinylcarbazole (PVK) derivative, a bicarbazole derivative, a polyphenylenevinylene derivative, a poly p-phenylene vinylene (PPV) derivative, a poly(meth) acrylate derivative, a poly(9,9-octylfluorene) derivative, a poly(spiro-fluorene) derivative, TCTA (tris(4-carbazol-9-yl phenyl)amine), TPD (N, N'-diphenyl-N,N'-bis(3-methylphenyl)-(1,1'-biphenyl)-4,4'-diamine), NPB (N,N'-di (naphthalen-1-yl)-N—N'-diphenyl-benzidine), m-MTDATA (tris(3-methylphenylphenylamino)-triphenylamine), TFB (poly[(9,9-dioctylfluorenyl-2,7-diyl-co(4,4'-(N-4-butylphenyl)diphenylamine]), PFB (poly(9,9-dioctylfluorene)-co-N, N-diphenyl-N,N-di-(p-butylphenyl)-1,4-diaminobenzene), poly-TPD, a metal oxide such as NiO and $MoO_3$, or a combination thereof, but is not limited thereto.

For example, the hole transport layer 150 may include TCTA and at least one of the compounds represented by Chemical Formula 1 to Chemical Formula 9 but is not limited thereto.

Chemical Formula 1

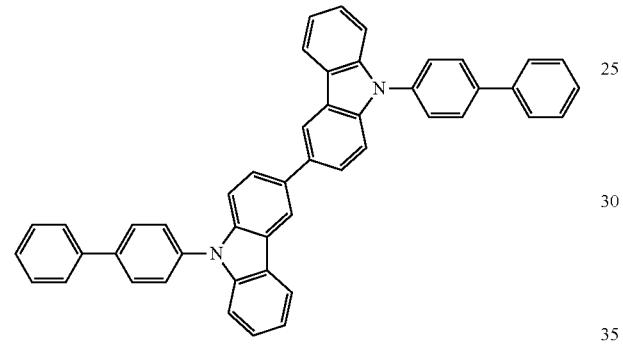

Chemical Formula 2

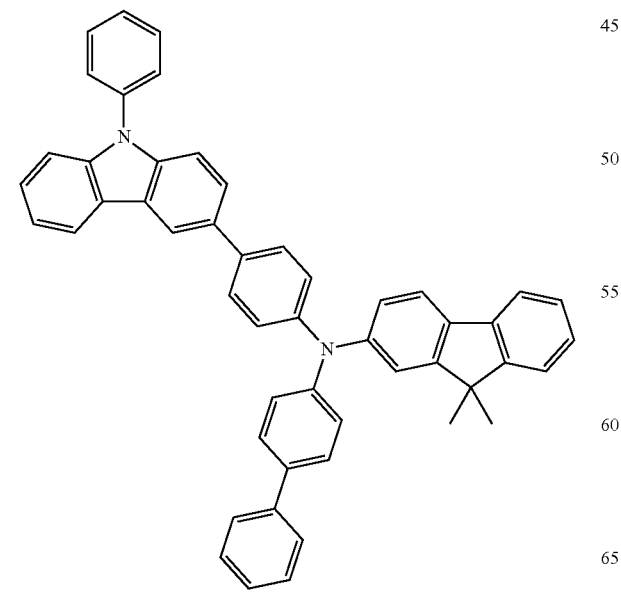

Chemical Formula 3

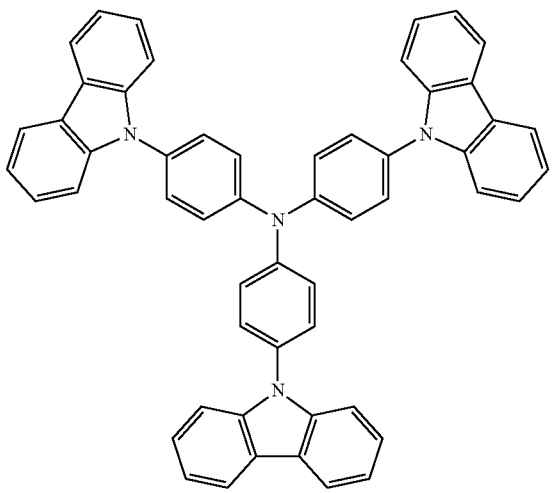

Chemical Formula 4

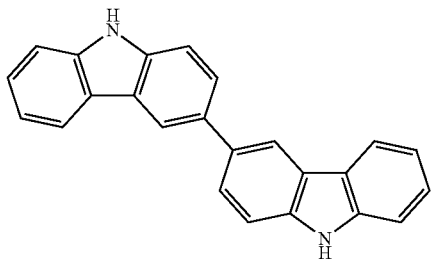

Chemical Formula 5

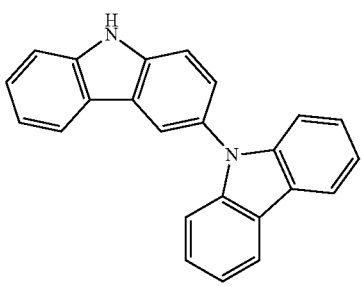

Chemical Formula 6

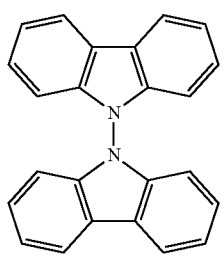

-continued

Chemical Formula 7

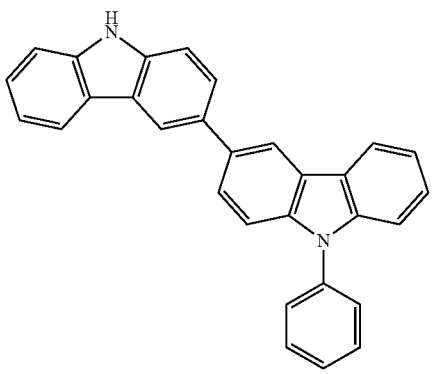

Chemical Formula 8

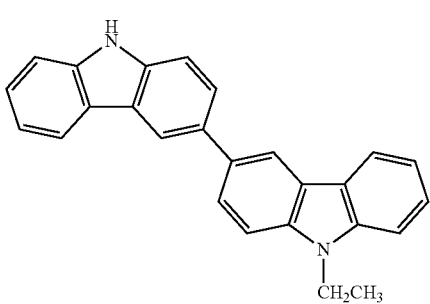

Chemical Formula 9

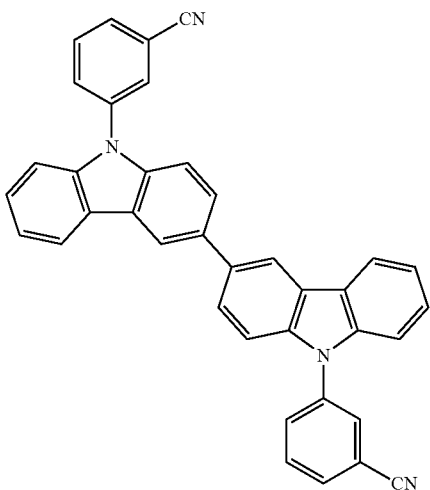

The hole transport layer 150 may be formed in a wet coating method such as spin coating and the like. In this way, the hole transport layer 150 may be formed on the emission layer 140 in a relatively simple method. Furthermore, when the emission layer 140 has, e.g., exhibits, hydrophobicity, a polar solvent may be selected as a solvent used for forming the hole transport layer 150 and damage of the emission layer 140 may be minimized.

For example, a polymer film such as PPV may be obtained by spin coating a precursor solution including a PPV precursor polymer and a polar solvent (e.g., water, methanol, ethanol, etc.) on the emission layer 140, thermally treating it, for example, under an inert gas atmosphere of $N_2$ or vacuum at a curing temperature of about 250° C. to about 300° C. for 3 hours to obtain a hole transport layer 150 composed of the PPV thin film.

The hole injection layer 160 may be disposed between the hole transport layer 150 and the second electrode 170. The hole injection layer 160 may supply holes into the emission layer 140 together with the hole transport layer 150. However, the hole injection layer 160 may be omitted in consideration of the thicknesses and materials of the hole transport layer 150.

On the other hand, the hole injection layer 160 may be formed of a p-type semiconductor material, or a material doped with a p-type dopant like the hole transport layer 150. For example, the hole injection layer 160 may include a PEDOT (poly (3,4-ethylenedioxythiophene)] derivative, a PSS[poly(styrene sulfonate)) derivative, a poly-N-vinylcarbazole (PVK) derivative, a polyphenylenevinylene derivative, a poly p-phenylene vinylene (PPV) derivative, a polymethacrylate derivative, a poly(9,9-octylfluorene) derivative, a poly(spiro-fluorene) derivative, TCTA (tris(4-carbazol-9-yl phenyl)amine), TPD (N,N'-diphenyl-N,N'-bis (3-methylphenyl)-(1,1'-biphenyl)-4,4'-diamine), NPB (N,N'-di(naphthalen-1-yl)-N,N'-diphenyl-benzidine), m-MTDATA (tris(3-methylphenyl-N-phenylamino)-triphenylamine), TFB (poly[(9,9-dioctylfluorenyl-2,7-diyl-co(4,4'-(N-4-butylphenyl)diphenylamine]), PFB (poly(9,9-dioctylfluorene)-co-N,N-diphenyl-N,N-di-(p-butylphenyl)-1,4-diaminobenzene), poly-TPD, a metal oxide such as NiO and $MoO_3$, or a combination thereof, but is not limited thereto.

As described above, in the electroluminescent device 10 according to an embodiment, the electron transport layer 120 includes the inorganic oxide particles 121 and the metal-organic compound or the thermal decomposition product thereof. Accordingly, the electroluminescent device 10 according to an embodiment may minimize void spaces between the neighboring inorganic oxide particles using the metal-organic compound or the thermal decomposition product thereof. As a result, the electroluminescent device 10 according to an embodiment may improve the luminous efficiency of the device by decreasing the leakage current.

Hereinafter, a display device including the electroluminescent device 10 is described.

A display device according to an embodiment includes a substrate, a driving circuit formed on the substrate, and a first electroluminescent device, a second electroluminescent device, and a third electroluminescent device spaced apart from each other in a predetermined interval and disposed on the driving circuit.

The first to third electroluminescent devices have the same structure as the electroluminescent device 10 and but the wavelengths of the lights emitted from each quantum dots may be different from each other.

In an embodiment, the first electroluminescent device may be a red device emitting red light, the second electroluminescent device may be a green device emitting green light, and the third electroluminescent device may be a blue device emitting blue light. In other words, the first to third electroluminescent devices may be pixels expressing, e.g., emitting, red, green, and blue, respectively, in the display device.

However, an embodiment is not necessarily limited thereto, but the first to third electroluminescent devices may respectively express, e.g., emit, one of magenta, yellow, cyan, or may express, e.g., emit, other colors.

On the other hand, one of the first to third electroluminescent devices may be the electroluminescent device 10. In this case, the third electroluminescent device expressing, e.g., emitting, blue may be desirably the electroluminescent device 10.

In the display device according to an embodiment, a hole injection layer, a hole transport layer, an electron transport layer, an electron injection layer, and a hole blocking layer except an emission layer of each pixel may be integrated to form a common layer. However, an embodiment is not limited thereto. A hole injection layer, a hole transport layer, an electron transport layer, an electron injection layer, and a hole blocking layer may be independently formed in each pixel of the display device, or a hole injection layer, a hole transport layer, an electron transport layer, an electron injection layer, a hole blocking layer, or a combination thereof may form a common layer and remaining layers may form a separate independent layer.

The substrate may be a transparent insulating substrate or may include a ductile material. The substrate may include a glass or polymer material and the polymer material may be a material having a glass transition temperature (Tg) of greater than about 150° C. For example, the substrate may include a COC (cycloolefin copolymer) or COP (cycloolefin polymer) based material. The first to third electroluminescent devices may be formed on the substrate. That is, a substrate of the display device according to an embodiment provides a common layer.

The driving circuit is disposed on the substrate and is independently connected to each of the first to third electroluminescent devices. The driving circuit may include a scan line, a data line, a driving power source line, a common power source line, or a combination thereof, at least two thin film transistors (TFT) connected to the wire and corresponding to one organic light emitting diode, and at least one capacitor, or the like. The driving circuit may have a variety of suitable structures.

As described above, a display device according to an embodiment may decrease a leakage current and improve device characteristics, and thus excellent electroluminescence characteristics may be exhibited.

Hereinafter, the embodiments are illustrated in more detail with reference to examples. However, these examples are exemplary, and the present disclosure is not limited thereto.

Example 1

An indium-tin-oxide (ITO) layer is deposited on a glass substrate, and a ZnO cluster layer having an average thickness of about 30 nanometers (nm) to 35 nm is formed thereon by spin-coating a composition for a first electron transport layer which is prepared by dispersing 3 millimoles (mmol) of ZnO particles having an average particle diameter of 4.5 nm in ethanol solvent at 4000 rpm for 40 seconds and then, drying the composition at 80° C. for 30 minutes.

Subsequently, on the ZnO cluster layer, 0.1 mmol of a zinc-oleate compound in which Zn and oleate are included in a mole ratio of 1:1 is dissolved in 1 milliliters (mL) of hexane, and then, the solution is spin-coated at 4000 revolutions per minute (rpm) for 40 seconds.

The spin-coated layer is washed by using hexane and then, dried at 80° C. for 30 minutes to remove the hexane to deduce crystallization of the zinc-oleate compound and thus form a layer including a zinc-oleate compound or a thermal decomposition product thereof on the ZnO cluster layer. The layer including the zinc-oleate compound or the thermal decomposition product thereof covers the upper surface of the ZnO cluster layer and has a thinner average thickness than that of the ZnO cluster layer.

Subsequently, on the layer including the zinc-oleate compound or the thermal decomposition product thereof, a blue emission layer having a thickness of 25 nm is formed by coating a composition for an emission layer, which is prepared by dispersing a blue quantum dot (a ZnSeTe/ZnSe/ZnS core-shell blue quantum dot) to which a hydrophobic organic ligand (oleic acid) is attached and a binder in octane, and then, drying the composition at 80° C. The blue quantum dot has a maximum light emitting wavelength in a range of 440 nm to 460 nm, a full width at half maximum (FWHM) in a range of 18 nm to 25 nm, and external quantum efficiency of greater than or equal to 85%.

After forming the blue emission layer, an electron transport layer has an average thickness (an average thickness sum of the ZnO cluster layer and the layer including the zinc-oleate compound or the thermal decomposition product thereof) in a range of about 35 nm to 45 nm.

Subsequently, on the blue emission layer, a tris(4-carbazol-9-yl phenyl)amine (TCTA) layer is formed by coating a composition for a hole transport layer, in which TCTA is dissolved in methanol, and then, heating the composition at a high temperature.

Then, a $MoO_3$ layer as a hole injection layer is formed by depositing $MoO_3$ on a TCTA layer.

On the $MoO_3$ layer, a silver (Ag) layer is deposited to manufacture an electroluminescent device (the ITO/ZnO cluster layer/the layer including the zinc-oleate compound or the thermal decomposition product thereof/the blue emission layer/TCTA/$MoO_3$/Ag) of Example 1.

Example 2

An electroluminescent device (an ITO/ZnO cluster layer/a layer including a zinc-oleate compound or a thermal decomposition product thereof/a red emission layer/Chemical Formula 1/$MoO_3$/Ag) of Example 2 is manufactured according to the same method as Example 1 except that a red emission layer is formed by using a red quantum dot (InP) to which a hydrophobic organic ligand (oleic acid) is attached instead of the blue quantum dot (ZnSeTe/ZnSe/ZnS) to which a hydrophobic organic ligand (oleic acid) is attached, and a hole transport layer formed of a bicarbazole-based compound represented by Chemical Formula 1 is included instead of the TCTA layer.

Comparative Example 1

An electroluminescent device (an ITO/ZnO cluster layer/a blue emission layer/TCTA/$MoO_3$/Ag) is manufactured according to the same method as Comparative Example 1 except that the blue emission layer is formed right on the ZnO cluster layer.

Comparative Example 2

An electroluminescent device (an ITO/ZnO cluster layer/a layer including a zinc-acetate compound or a thermal decomposition product thereof/a blue emission layer/TCTA/$MoO_3$/Ag) is manufactured according to the same method as Example 1 except that a composition for a second electron transport layer is prepared by dissolving 0.1 mmol of a zinc-acetate compound including Zn and acetate in a mole ratio of 1:1 in 1 mL of ethanol, and a layer including a zinc-acetate compound or a thermal decomposition product thereof is formed instead of the layer including a zinc-oleate compound or a thermal decomposition product thereof.

Comparative Example 3

An electroluminescent device (an ITO/ZnO cluster layer/a $ZnCl_2$/blue emission layer/TCTA/$MoO_3$/Ag) is manufactured according to the same method as Example 1 except that a $ZnCl_2$ layer is formed by using a composition for a second electron transport layer which is prepared by dissolving 0.1 mmol of $ZnCl_2$ in 1 mL of acetone, instead of the layer including a zinc-oleate compound or a thermal decomposition product thereof, and also, using acetone instead of the hexane for the washing.

Comparative Example 4

An electroluminescent device (an ITO/ZnO cluster layer/a layer including a zincdiethyldithiocarbamate compound or a thermal decomposition product thereof/a blue emission layer/TCTA/$MoO_3$/Ag) is manufactured according to the same method as Example 1 except that a layer including a zinc-diethyldithiocarbamate compound or a thermal decomposition product thereof instead of the layer including a zinc-oleate compound or a thermal decomposition product thereof is formed by using a composition for a second electron transport layer prepared by dissolving 0.1 mmol of a zinc-diethyldithiocarbamate compound including Zn and diethyldithiocarbamate including in a mole ratio of 1:1 in chloroform ($CHCl_3$) and also, using chloroform instead of the hexane for the washing.

Comparative Example 5

An electroluminescent device (an ITO/ZnO cluster layer/a red emission layer/Chemical Formula 1/$MoO_3$/Ag) is manufactured according to the same method as Example 2 except that the red emission layer is formed right on the ZnO cluster layer.

Evaluation 1: Comparison of Surface Images Between Surfaces of ZnO Cluster Layer and ZnO Cluster Layer/Layer Including Zinc-Oleate Compound or Thermal Decomposition Product FIGS. 5 and 6 respectively show the upper surface of the ZnO cluster layer in Comparative Example 1 and the surface of the layer including a zinc-oleate compound or a thermal decomposition product thereof on the ZnO cluster layer in Example 1.

Figure 5:
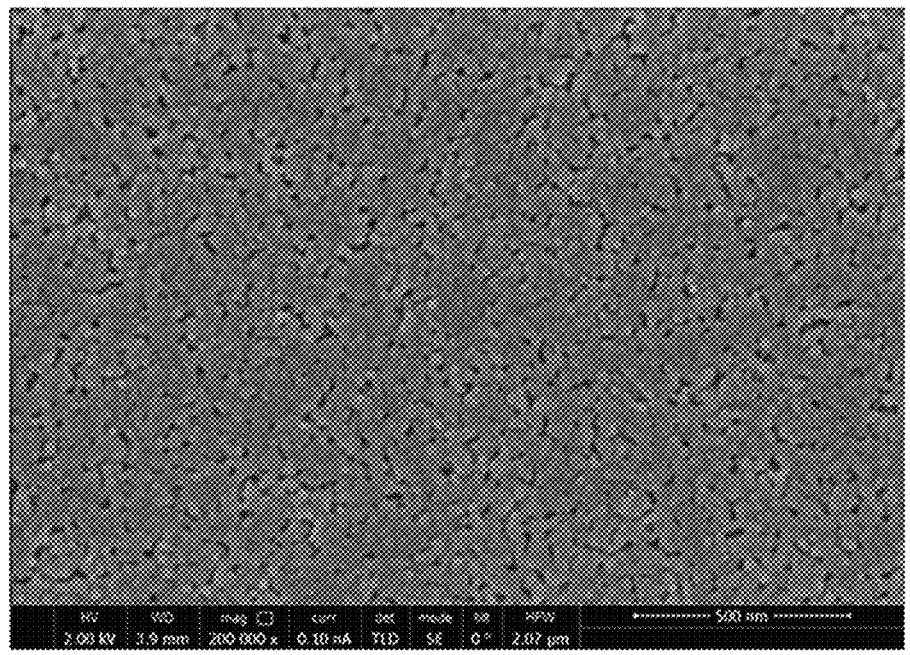
FIG. 5 shows a scanning electron microscopic (SEM) image of the surface of the ZnO cluster layer of Comparative Example 1.
Figure 6:
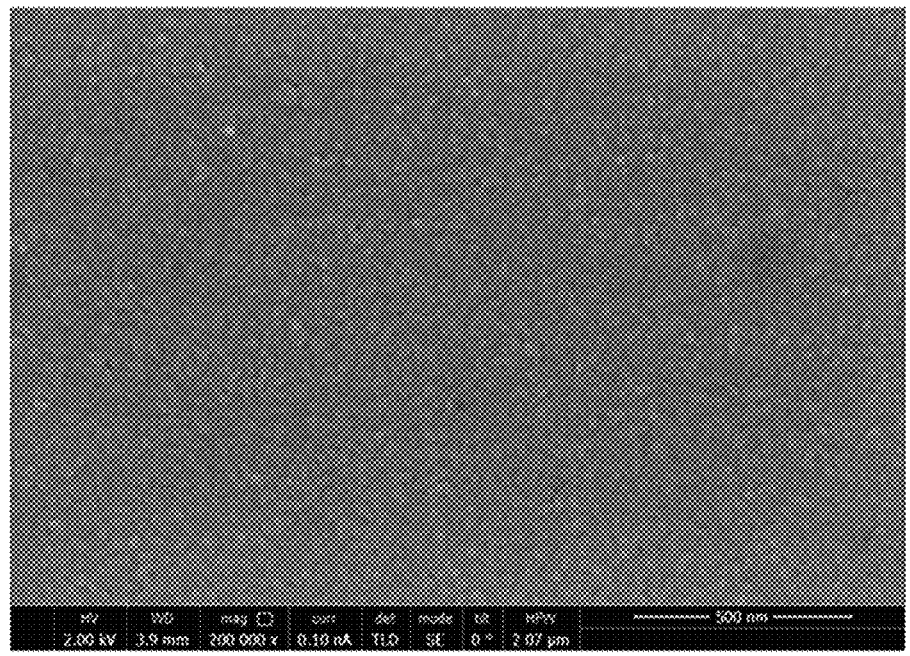
FIG. 6 is a SEM image of the surface of a zinc-oleate or a thermal decomposition product layer thereof formed on the ZnO cluster layer of Example 1.

FIG. 5 shows a scanning electron microscopic (SEM) image of the surface of the ZnO cluster layer of Comparative Example 1, and FIG. 6 is a SEM image of the surface of a zinc-oleate or a thermal decomposition product layer thereof formed on the ZnO cluster layer of Example 1.

Referring to FIG. 5, the ZnO cluster layer of Comparative Example 1 has a first region (a relatively bright region) filled with ZnO particles and a second region (a black region) not filled with the ZnO particles but left as an empty space, as described above. This second region left as an empty space includes a void and/or a crack and may work as a leakage path during electron transportation of a device.

On the other hand, referring to FIG. 6, the layer including a zinc-oleate compound or a thermal decomposition product thereof of Example 1 may be formed to cover the ZnO cluster layer as well as partially and/or fully fill the empty space on the surface of the ZnO cluster layer. Accordingly, when the layer including a zinc-oleate compound or a thermal decomposition product thereof of the Examples is formed right on the ZnO cluster layer, the void and/or the crack in the ZnO cluster layer may be removed or minimized.

Evaluation 2: Device Characteristics of Electroluminescent Devices of the Examples and Comparative Examples Relationships between voltage-current density and luminance-external quantum efficiency of the electroluminescent devices of Example 1 and Comparative Examples 1 to 4 are shown in FIGS. 7 to 8, respectively.

Figure 7:
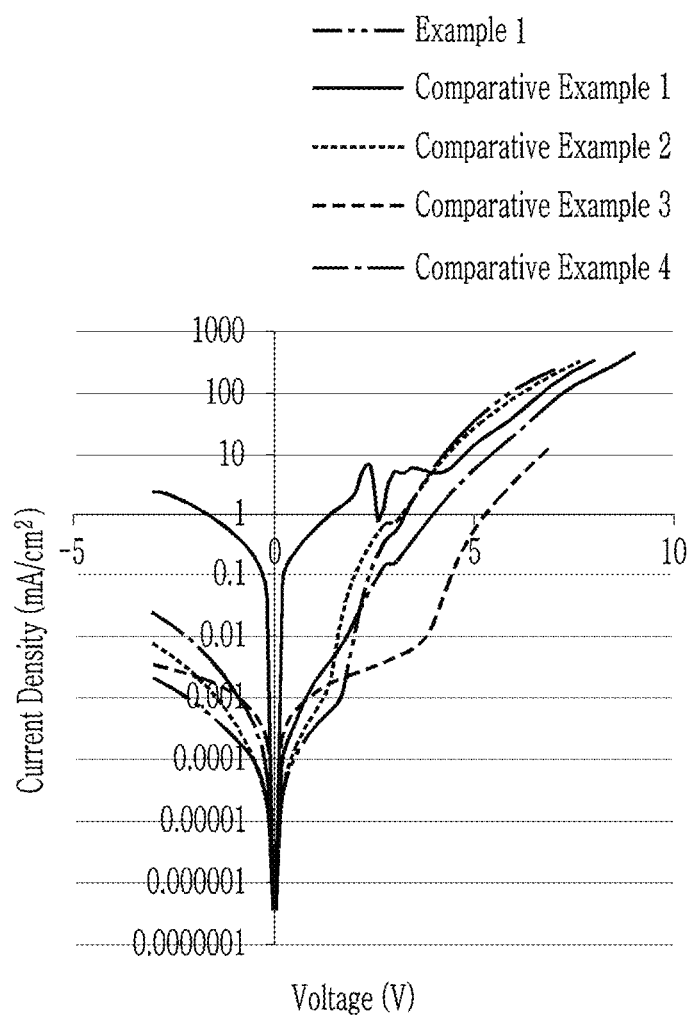
FIG. 7 is a graph of current density (milliamperes per square centimeter ($mA/cm^2$)) versus voltage (volts (V)) of the electroluminescent devices of Example 1 and Comparative Examples 1 to 4.

FIG. 7 is a voltage-current density curve of the electroluminescent devices of Example 1 and Comparative Examples 1 to 4. In FIG. 7, the change of the current density according to the voltage is represented by a log scale.

Referring to FIG. 7, an electroluminescent device having the electron transport layer (the layer including a ZnO cluster layer/zinc-oleate compound or a thermal decomposition product thereof) of Example 1 exhibits a current density increase at a voltage of less than or equal to about 2.5 V compared with the electroluminescent devices of the Comparative Examples and particularly, a stable current density increase effect compared with Comparative Examples 1, and an excellent current density increase effect compared with Comparative Examples 3 to 4.

Figure 8:
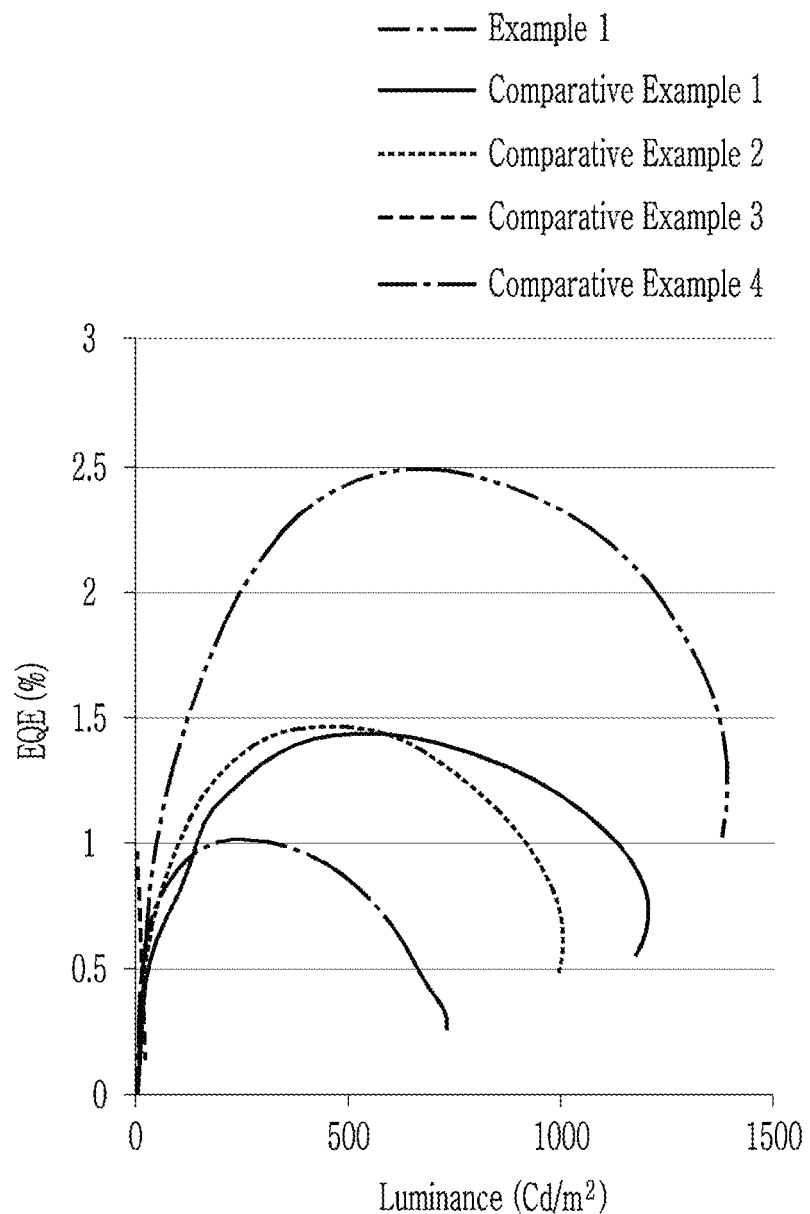
FIG. 8 is a graph of external quantum efficiency (EQE (percent (%))) versus luminescence (candela per square meter ($Cd/m^2$)) of the electroluminescent devices of Example 1 and Comparative Examples 1 to 4.

FIG. 8 is a luminance-external quantum efficiency (EQE) curve showing the electroluminescent devices of Example 1 and Comparative Examples 1 to 4.

Referring to FIG. 8, the electroluminescent device of Example 1 exhibits 1.8 times to 2.5 times higher maximum external quantum efficiency than those of the Comparative Examples. In addition, when external quantum efficiency is compared depending on a particular luminance, Example 1 exhibits about 1.4% of external quantum efficiency at 100 nits (candelas per square meter), Comparative Example 1 exhibits about 0.8% of external quantum efficiency at 100 nits, Comparative Examples 2 and 4 respectively show about 1.0% of external quantum efficiency at 100 nits, and Comparative Example 3 exhibits about 0% of external quantum efficiency at 100 nits.

In addition, as for external quantum efficiency at 500 nits, Example 1 exhibits about 2.4%, Comparative Example 1 exhibits about 1.4%, Comparative Example 2 exhibits about 1.5%, Comparative Example 3 exhibits 0%, and Comparative Example 4 exhibits about 0.9%, and as for external quantum efficiency at 1000 nits, Example 1 exhibits about 2.3%, Comparative Example 1 exhibits about 1.2%, Comparative Example 2 exhibits about 0.5%, and Comparative Examples 3 and 4 respectively show about 0%.

On the other hand, as for maximum luminance of each electroluminescent device, Example 1 exhibits about 1400 $Cd/m^2$, Comparative Example 1 exhibits about 1200 $Cd/m^2$, Comparative Example 2 exhibits about 1000 $Cd/m^2$, Comparative Example 3 exhibits about 24 $Cd/m^2$, and Comparative Example 4 exhibits about 740 $Cd/m^2$.

First, Comparative Example 3 exhibits deteriorated properties relative to the other Comparative Examples. While not wanting to be bound by theory, it is understood that the reason that Comparative Example 3 exhibits deteriorated properties relative to the other Comparative Examples is that when $ZnCl_2$ instead of the metal-organic compound is included as a compound for forming the electron transport layer, the $ZnCl_2$ layer on the ZnO cluster layer has equivalent or more voids and/or cracks than the ZnO cluster layer. Accordingly, when a second electron transport layer is formed by using not a metal-organic compound but an inorganic compound such as $ZnCl_2$ and the like, device characteristics are more difficult to realize.

On the other hand, Comparative Examples 2 to 4 using a polar solvent during formation of the layer including a metal-organic compound or a thermal decomposition product thereof show equivalent external quantum efficiency and/or maximum luminance (Comparative Example 2) to those of Comparative Example 1 having only a ZnO cluster layer and much deteriorated external quantum efficiency and/or maximum luminance (Comparative Examples 3 and 4) compared with those of Comparative Example 1. Accordingly, while not wanting to be bound by theory, it is understood that when a metal-organic compound having solubility in a non-polar solvent is deposited using a polar solvent instead, the polar solvent may have an influence on the ZnO cluster layer.

In other words, Comparative Examples 2 to 4 fills a void and/or a crack of a ZnO cluster layer by using a metal-organic compound or a thermal decomposition product thereof similarly to Example 1 but with a polar solvent, which results in damage and the like on the ZnO cluster layer by the polar solvent, and accordingly, the metal-organic compound or the thermal decomposition product thereof has no significant effect (Comparative Example 2) and rather exhibits deteriorated performance (Comparative Examples 3 and 4).

Accordingly, when a layer including a metal-organic compound or a thermal decomposition product thereof on a ZnO cluster layer is formed by using a metal-organic compound having solubility in a non-polar solvent, and a non-polar solvent is used, Example 1 exhibits excellent external quantum efficiency over about 100 nits to 1000 nits compared with Comparative Examples.

Evaluation 3: Life-span Characteristics of Electroluminescent Devices of the Examples and Comparative Examples Life-span characteristics of the electroluminescent devices (blue) of Example 1 and Comparative Example 1 and life-span characteristics of the electroluminescent devices (red) of Example 2 and Comparative Example 5 are shown in FIGS. 9 to 10, respectively.

Figure 9:
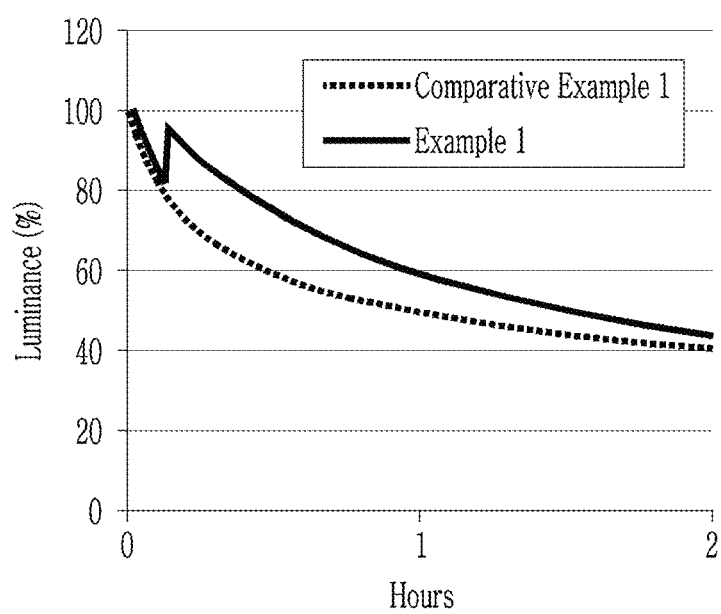
FIG. 9 is a graph of luminance (%) versus hours showing life-span characteristics of the electroluminescent devices of Example 1 and Comparative Example 1.
Figure 10:
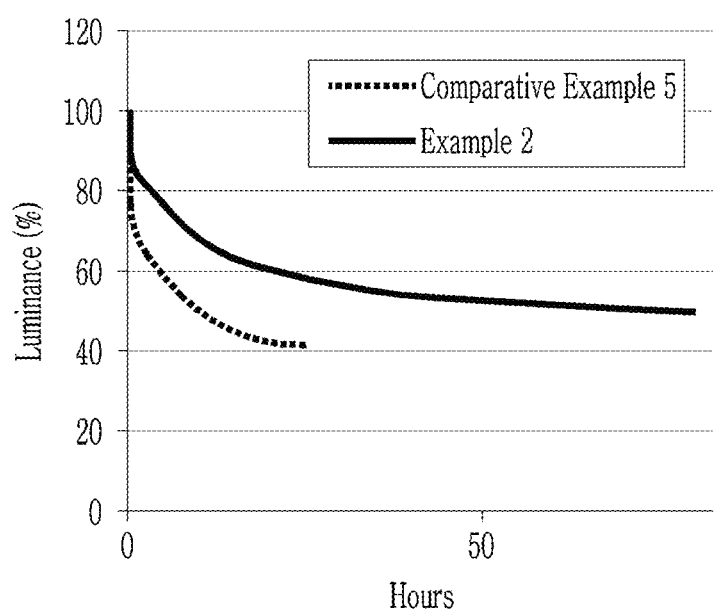
FIG. 10 is a graph of luminance (%) versus hours showing life-span characteristics of the electroluminescent devices of Example 2 and Comparative Example 5.

FIG. 9 shows life-span characteristics of the electroluminescent devices of Example 1 and Comparative Example 1 and FIG. 10 shows life-span characteristics of the electroluminescent devices of Example 2 and Comparative Example 5.

Referring to FIGS. 9 and 10, since Example 1 exhibits a luminance of 50% (T50) of about 1.5 hours, while Comparative Example 1 exhibits T50 of about 1 hour, Example 1 exhibits an about 1.5 times life-span improvement effect with a reference to that of a blue electroluminescent device. On the other hand, Example 2 exhibits T50 of about 67.7 hours, while Comparative Example 5 exhibits T50 of about 9.7 hours, and thus an about 7 times life-span improvement effect with a reference to a red electroluminescent device.

Accordingly, the electroluminescent devices of the Examples exhibit excellent life-span characteristics compared with the Comparative Examples, which did not include a layer of a metal-organic compound or a thermal decomposition product thereof. While not wanting to be bound by theory, it is understood that the reason the electroluminescent devices of the Examples exhibit excellent life-span characteristics compared with the Comparative Examples is that the layer of a metal-organic compound or a thermal decomposition product thereof makes possible a stable current injection into an electron transport layer and thus improves a charge carrier balance.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

| | |
|---|---|
| 10: electroluminescent device | 100: substrate |
| 110: first electrode | 120: electron transport layer |
| 121: inorganic oxide particle | 124: first layer |
| 126: second layer | 140: emission layer |
| 141: light emitting particle | 150: hole transport layer |
| 160: hole injection layer | 170: second electrode |

What is claimed is:

1. An electroluminescent device, comprising
a first electrode and a second electrode facing each other;
an emission layer disposed between the first electrode and the second electrode, the emission layer comprising light emitting particles;
an electron transport layer disposed between the first electrode and the emission layer; and
a hole transport layer disposed between the second electrode and the emission layer,
wherein the electron transport layer comprises
inorganic oxide particles and
a metal-organic compound or a thermal decomposition product of the metal-organic compound, and
wherein the metal-organic compound comprises an oleate compound.

2. The electroluminescent device of claim 1, wherein the metal-organic compound comprises Zn, Ti, Sn, W, Ta, Mg, Ga, Na, Cu, Ag, or a combination thereof.

3. The electroluminescent device of claim 1, wherein the inorganic oxide particles comprise zinc, titanium, zirconium, tin, tungsten, tantalum, magnesium, gallium, sodium, copper, silver, or a combination thereof.

4. The electroluminescent device of claim 1, wherein the inorganic oxide particles are dispersible in a polar solvent.

5. The electroluminescent device of claim 1, wherein a surface of the electron transport layer facing the emission layer comprises
a first portion in which the inorganic oxide particles are disposed and
a second portion in which the metal-organic compound or the thermal decomposition product of the metal-organic compound is between neighboring inorganic oxide particles.

6. The electroluminescent device of claim 1, wherein the electron transport layer comprises
a first layer comprising the inorganic oxide particles and
a second layer comprising the metal-organic compound or the thermal decomposition product of the metal-organic compound.

7. The electroluminescent device of claim 6, wherein the second layer is disposed between the first layer and the emission layer.

8. The electroluminescent device of claim 6, wherein the first layer comprises a cluster layer comprising the inorganic oxide particles, and wherein a surface of the first layer facing the second layer comprises the metal-organic compound or the thermal decomposition product of the metal-organic compound.

9. The electroluminescent device of claim 6, wherein the first layer comprises an organic matrix filled in between neighboring inorganic oxide particles and the organic matrix comprises an organic material that is different from the metal-organic compound or the thermal decomposition product of the metal-organic compound.

10. The electroluminescent device of claim 6, wherein an average thickness of the second layer is less than an average thickness of the first layer.

11. The electroluminescent device of claim 1, wherein the inorganic oxide particles comprise metal oxide particles, and
a metal in the metal oxide particles and a metal in the metal-organic compound are the same.

12. The electroluminescent device of claim 1, wherein an average thickness of the electron transport layer is about 20 nanometers to about 60 nanometers.

13. The electroluminescent device of claim 1, wherein the light emitting particles comprise quantum dots.

14. The electroluminescent device of claim 1, wherein the light emitting particles have a core-shell structure.

15. The electroluminescent device of claim 1, wherein the light emitting particles comprise a Group II-VI compound that does not comprise Cd, a Group III-V compound, a Group IV-VI compound, a Group IV element or compound, a Group I-III-VI compound, a Group I-II-IV-VI compound that does not comprise Cd, or a combination thereof.

16. The electroluminescent device of claim 1, wherein a hydrophobic organic ligand is attached to a surface of the light emitting particles.

17. A display device comprising the electroluminescent device of claim 1.

18. A method of forming an electroluminescent device, the method comprising
disposing a first electrode and a second electrode facing each other;
disposing an emission layer between the first electrode and the second electrode, the emission layer comprising light emitting particles;
disposing an electron transport layer between the first electrode and the emission layer, the electron transport layer comprising
inorganic oxide particles, and
a metal-organic compound or a thermal decomposition product of the metal-organic compound; and
disposing a hole transport layer between the second electrode and the emission layer,
wherein the metal-organic compound comprises an oleate compound.

19. An electroluminescent device, comprising
a first electrode and a second electrode facing each other;
an emission layer disposed between the first electrode and the second electrode, the emission layer comprising light emitting particles;
an electron transport layer disposed between the first electrode and the emission layer; and
a hole transport layer disposed between the second electrode and the emission layer,
wherein the electron transport layer comprises
inorganic oxide particles and
a thermal decomposition product of a metal-organic compound, and
wherein the metal-organic compound comprises an oleate compound, an amine compound, or a combination thereof.

* * * * *